United States Patent [19]

Latta et al.

[11] Patent Number: 4,526,629
[45] Date of Patent: Jul. 2, 1985

[54] CATALYTIC OXIDATION OF SOLID MATERIALS

[75] Inventors: Ernst-Eberhard Latta, Adliswil, Switzerland; Maria Ronay, Briarcliff Manor, N.Y.

[73] Assignee: International Business Machines Corporation, Armonk, N.Y.

[21] Appl. No.: 610,355

[22] Filed: May 15, 1984

[51] Int. Cl.$^3$ .................................. H01L 21/363
[52] U.S. Cl. ....................... 148/1.5; 29/571; 29/590; 357/5; 427/331; 427/419.3; 148/DIG. 16; 148/DIG. 89; 148/DIG. 117; 148/DIG. 118
[58] Field of Search ....... 148/1.5, DIG. 16, DIG. 89, 148/DIG. 116, DIG. 117, DIG. 118, 98

[56] References Cited

U.S. PATENT DOCUMENTS 4,001,317  1/1977  Grasselli et al. ............... 502/304 X
4,274,981  6/1981  Suzuki et al. .................. 502/304 X
4,341,662  7/1982  Pfefferle ....................... 502/304 X

OTHER PUBLICATIONS

Sanz L. Hofmann; J. of Less-Common Metals; vol. 92, p. 317 (1983).
Forster et al.; Planar Area Definition Using Two-Level Self-Aligned Insulation Scheme, IBM Tech. Disc Bull.; vol. 26, No. 8, pp. 4254–4255, Jan. 1984.
Matsuda et al.; Study of Nb-Based Josephson Tunnel Junctions, J. Appl. Phys., vol. 51, No. 8, pp. 4310–4316, Aug. 1980.
Broom et al.; Niobium Oxide–Barrier Tunnel Junction, IEEE Trans. Elec. Dev., vol. ED-27, No. 10, pp. 1998–2008, Oct. 1980.

*Primary Examiner*—Brian E. Hearn
*Assistant Examiner*—David A. Hey
*Attorney, Agent, or Firm*—Carl C. Kling

[57] ABSTRACT

One or more monolayers of cerium arrayed on the surface of a niobium metal acts as a catalyst to oxidation of the niobium at ambient temperature and results in a very thin, very high quality insulating layer which may be configured by patterning of the catalyst. Significant amounts of $Nb_2O_5$ are formed at pressures as low as $6.6 \times 10^{-6}$ Pa, promoted by the presence of the cerium. This catalytic activity is related to the trivalent to tetravalent valence change of the cerium during oxidation. The kinetics of $Nb_2O_5$ formation beneath the oxidized cerium shows two stages:

the first stage is fast growth limited by ion diffusion;
the second stage is slow growth limited by electron tunneling.

Other catalytic rare earths usable instead of cerium are terbium and praseodymium; other substrate materials usable instead of niobium are aluminum, hafnium, silicon and tantalum, or oxidizable alloys thereof.

6 Claims, 6 Drawing Figures 4,526,629

CATALYTIC OXIDATION OF SOLID MATERIALS

BACKGROUND OF THE INVENTION

1. Field of the Invention

This invention relates to preparation of oxide layers on materials such as metals and semiconductors, and relates more particularly to catalytic oxidation of such materials, at temperatures near ambient, to form high quality ultrathin insulating materials on process intermediates useful in producing integrated circuit devices.

2. Description of the Prior Art

In recent years, there has been considerable interest in the room temperature oxidation of polycrystalline niobium because of its application as tunnel barrier material in superconductive Josephson junctions. The prime concern was to find direct evidence for the existence of suboxides which are thought to be the cause of large excess currents. X-ray photoelectron spectroscopy (XPS) studies showed that the oxidation of niobium is characterized by an initial fast oxygen sorption, then the formation of a thin layer of NbO and $NbO_2$ followed at larger oxygen exposures by the formation of $Nb_2O_5$ on the surface. The lower oxides of niobium exhibit inferior insulating characteristics as contrasted to $Nb_2O_5$. Sanz and Hofmann determined the kinetics of $Nb_2O_5$ formation, which under ultrahighvacuum (UHV) conditions in dry oxygen followed a logarithmic growth law, attaining a thickness of 0.2 nanometer after an oxygen exposure of $10^4$ L ($1L = 10^{-6}$ Torr·sec $= 1.32 \times 10^{-4}$ Pa·sec). J. M. Sanz & S. Hofmann, J. of the Less-Common Metals, Volume 92, p. 317 (1983).

XPS and core electron energy loss spectroscopy studies of the surface oxidation of cerium suggest the initial formation of $Ce_2O_3$ followed by a thin layer of $CeO_2$ on the surface. Only trivalent oxide is formed upon oxidation with water vapor. See B. E. Koel et al., J. Electr. Spectr. Rel. Phen. Vol. 21, p. 31 (1980), and G. Strasser and F. P. Netzer, J. Vac. Sci. Tech., Section A, Vol. 2, page 826 April-May 1984.

There are a number of metals, including aluminum and niobium, which form intrinsic oxides when exposed to air at ambient temperatures. However, there is no known catalytic oxidation of solids prior to that of laboratory work resulting in this patent specification. Further X-ray photoemission spectroscopy studies (XPS) showed that the air oxidation of niobium could be suppressed by the use of thin aluminum, thin yttrium or magnesium, ytrrium or erbium overlayers.

Techniques for preparing insulating oxide layers generally required elevated temperatures, even though these temperatures were known to be undesirable because they exascerbated other problems such as spread of contaminants or diffusion of dopants beyond the optimum. Studies of oxides were carried out in a great number of laboratories because of the great interest in integrated circuits. These studies did not result in the knowledge that ambient temperature oxidation of meaningful insulation layers could be accomplished at all, much less provide the knowledge of actual techniques for carrying out any such oxidation, still less provide the knowledge of actual catalyst and method choices. Oxide layers required for semiconductor integrated circuits and other integrated circuits, continued to require elevated temperatures.

Certain catalysts, such as platinum, rhodium, palladium and cerium, but in particular platinum, have become common in the automobile industry for purifying exhaust gases. The exhaust catalytic reactions take place at elevated temperatures and involve gaseous components only. See, for example, U.S. Pat. No. 4,274,981, Suzuki et al., CATALYST FOR PURIFYING EXHAUST GAS AND THE PROCESS FOR MANUFACTURE THEREOF, June 23, 1981.

Certain rare earths and metals have known catalytic characteristics. Germanium, cerium, thorium, manganese, niobium, chromium, praseodymium, yttrium, zirconium, ruthenium, gallium, tin, indium, copper, lanthanum, tantalum and tungsten, plus others, have been listed in a context of oxidation promotion. See, for example, U.S. Pat. No. 4,001,317, Grasselli et al, PROCESS FOR THE OXIDATION OF OLEFINS USING CATALYSTS CONTAINING VARIOUS PROMOTER ELEMENTS, Jan. 4, 1977.

The prior art deals with gaseous and organic materials, not with process intermediates used in production of semiconductors, and not with oxidation of solids.

SUMMARY OF THE INVENTION

The object of the invention is to prepare usable insulating layers by oxidizing materials catalytically at temperatures far below the process parameters of pressure and temperature normally required for such oxidation reactions.

A feature of the invention is the use of some monolayers of cerium, or of other rare element which undergoes valuable change from trivalent to tetravalent upon surface oxidation, to result in a smooth thin oxide layer of high quality.

An advantage of the invention is that it provides a usable pattern of insulating layers of high quality, at low cost, and without the need for high temperatures, in such fashion that the catalyst pattern is either acceptable in place or easily removable.

The foregoing and other objects, features and advantages of the invention will be apparent from the more particular description of the preferred embodiments of the invention, as illustrated in the accompanying drawing.

DESCRIPTION OF PREFERRED EMBODIMENTS OF THE INVENTION

Cerium, arrayed as one or a few monolayers on a substrate surface of niobium metal, acts as a catalyst to oxidation of the niobium substrate at ambient temperature and results in a thin, very high quality insulating layer. Certain other catalysts, generally rare earths which experience a rising valence change during oxidation reactions, can be used, as can certain other substrate materials, generally oxidizable metals or semiconductors.

Significant amounts of $Nb_2O_5$ are formed at pressures as low as $6.6 \times 10^{-6}$ Pa, promoted by the presence of the cerium. This catalytic activity is related to the trivalent to tetravalent valence change of the cerium during oxidation. The kinetics of $Nb_2O_5$ formation beneath the oxidized cerium shows two stages:

the first stage is fast growth limited by ion diffusion;
the second stage is slow growth limited by electron tunneling.

Even a very thin overlayer of cerium enhances the oxidation of niobium nickel. For example, after only 200L oxygen exposure, 4.5 nm of $Nb_2O_5$ forms underneath the oxidized cerium and no lower oxides are detected.

To embody the invention, useful generally as a method for producing a process intermediate for integrated circuit manufacture, the preferred starting material is niobium which has been deposited from the vapor upon a suitable substrate. Processing is preferably carried out in a UHV system.

Figure 1:
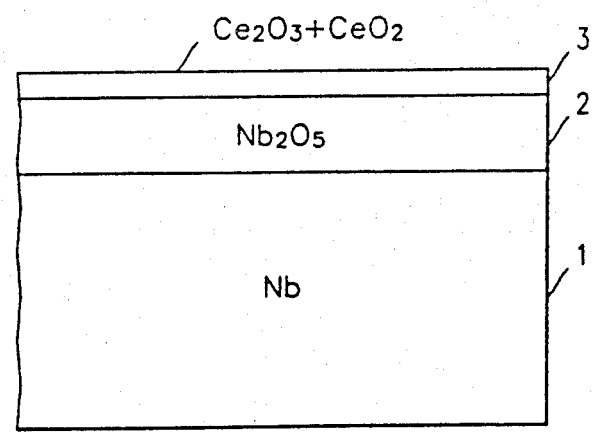
FIG. 1 is a diagrammatic sketch of an integrated circuit process intermediate according to a preferred embodiment of the invention.

Niobium films and cerium overlayers are evaporated and oxidized at 300K to form the process intermediate shown in FIG. 1. Substrate metal niobium 1 (which may in turn be supported on some other substrate) has been oxidized to include $Nb_2O_5$ layer 2; the thin catalyst layer of cerium has been oxidized to $CeO_2+Ce_2O_3$ layer 3.

Subsequent analysis confirms the catalytic oxidation by analyzing in situ with XPS, performed with Mg K alpha excitation (1252.6 eV), the direction of observation being nearly perpendicular to the surface.

Figure 2:
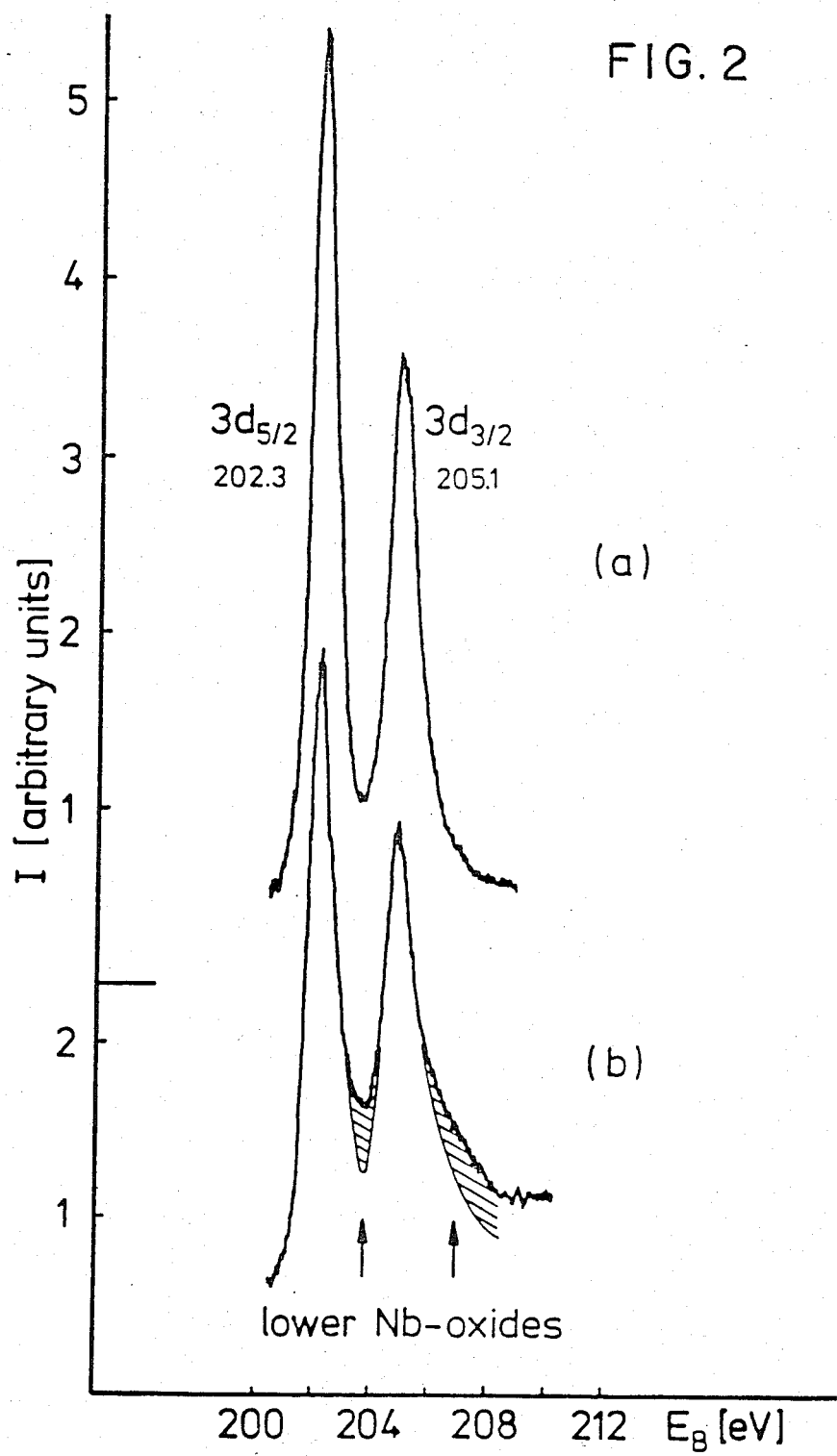
FIG. 2 is a composite XPS spectrum of:
(a) 25 nm freshly evaporated niobium showing only the electron levels of the clean metal, the Nb $3d_{5/2}$ peak at 202.3 eV and the Nb $3d_{3/2}$ peak at 205.1 eV binding energies.
(b) After a 20 minute exposure to $6.6 \times 10^{-6}$ Pa pure oxygen at 300K, the Nb 3d levels show only the formation of a small amount of lower Nb-oxides.

First evaporate about 25 nm niobium; its XPS spectrum shows only the electron levels of the clean metal. A plot of the Nb $3d_{5/2}$ peak at 202.3 eV and the Nb $3d_{3/2}$ peak at 205.1 eV binding energies is given in FIG. 1 trace (a). After a 20 minute exposure to $6.6 \times 10^{-6}$ Pa pure oxygen the Nb 3d levels show only the formation of a small amount of lower Nb-oxides as seen in FIG. 2 trace (b).

Figure 3:
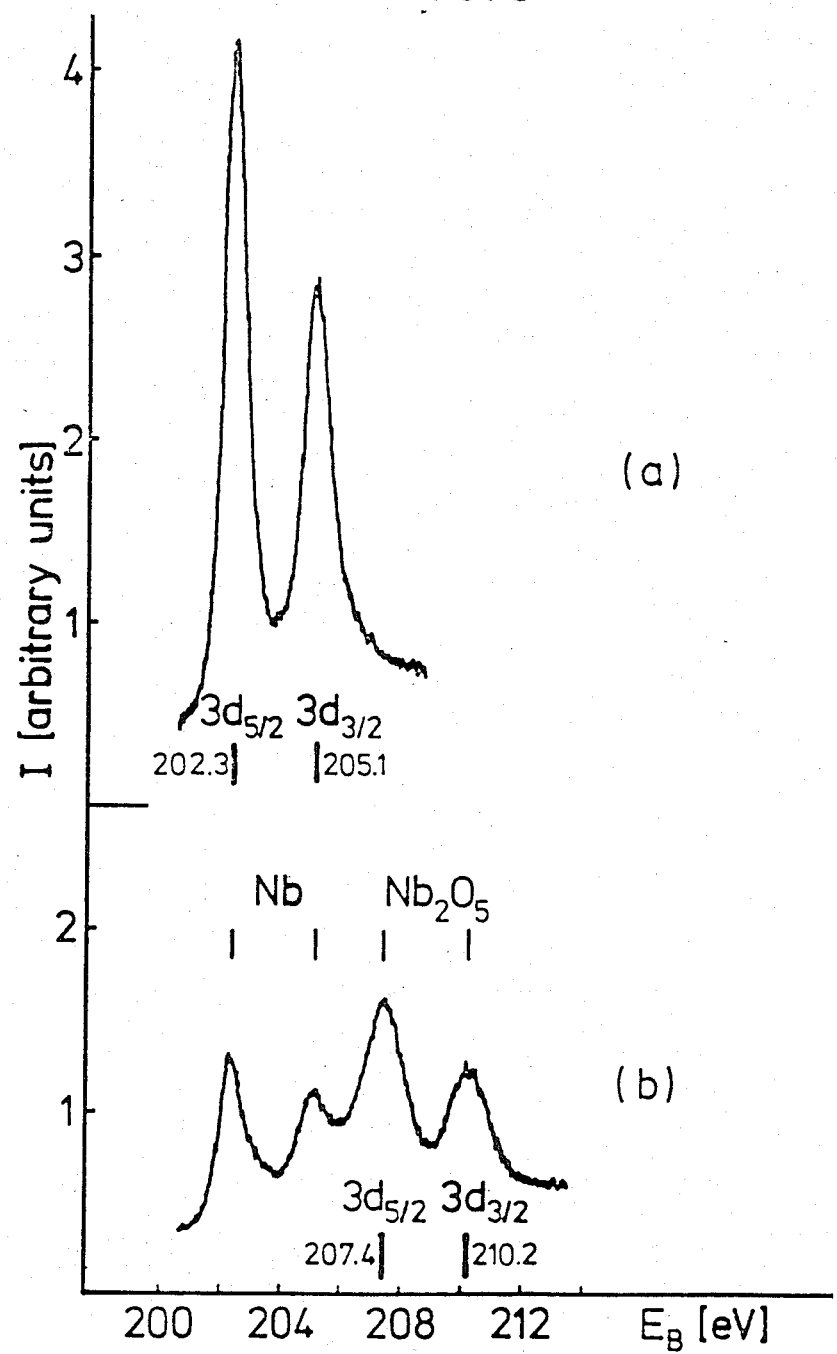
FIG. 3 is an XPS spectrum of 25 nm freshly evaporated niobium covered by 0.6 nm of cerium, showing:
(a) The Nb 3d levels before exposure to oxygen; and
(b) The Nb 3d levels after an exposure to $6.6 \times 10^{-6}$ Pa oxygen for 20 minutes at 300K, showing a significant amount of $Nb_2O_5$ formation characterized by a 5.1 eV chemical shift of the Nb 3d levels.

Evaporate 25 nm niobium on any suitable substrate, and on top of the niobium evaporate 0.6 nm cerium. FIG. 3 trace (a) shows the Nb 3d levels at this point. After an exposure to $6.6 \times 10^{-6}$ Pa pure oxygen for 20 minutes, a significant amount of niobium oxide is formed, as shown in FIG. 2 trace (b). The resulting niobium oxide is characterized by a 5.1 eV chemical shift of the Nb 3d levels. This binding energy at 207.4 eV for Nb $3d_{5/2}$ and at 210.2 eV for Nb $3d_{5/2}$ is characteristic of $Nb_2O_5$.

The thickness of the oxide, $t_{ox}$ can be estimated as shown in Equation 1:

$$t_{ox} = \lambda_{ox}\sin\theta \ln\left(\frac{I_{ox}n_m\lambda_m}{I_m n_{ox}\lambda_{ox}} + 1\right) \quad (1)$$

where $\lambda_{ox}$ and $\lambda_m$ are electron mean free paths, $I_{ox}$ and $I_m$ integrated intensities, $n_{ox}$ and $n_m$ Nb atom densities, in the oxide and the metal respectively, and $\theta$ is the detection angle from the sample plane. The electron mean free paths employed in calculating the oxide thickness were 1.4 nm for niobium, 2.4 nm for $Nb_2O_5$; $n_m/n_{ox}=2.69$. According to Equation 1 the thickness of the $Nb_2O_5$ layer due to 20 minutes oxidation at $6.6 \times 10^{-6}$ Pa is 3.5 nm.

In a variation of the preferred embodiment, different thicknesses of cerium overlayers (0.5 nm, 1 nm and 2 nm) when exposed to the same oxidation treatment, produce identical amounts of $Nb_2O_5$; the catalytic action of cerium is independent of its thickness in the range 0.5-2 nm.

When 25 nm if niobium covered by 0.5 nm of cerium is exposed for 20 minutes to $6.6 \times 10^{-6}$ Pa $H_2O$ vapor instead of oxygen, no $Nb_2O_5$ is formed.

Results confirm the formation of a mixture of $Ce_2O_3$ and $CeO_2$ on the surface, if oxidation takes place in pure oxygen.

Figure 4:
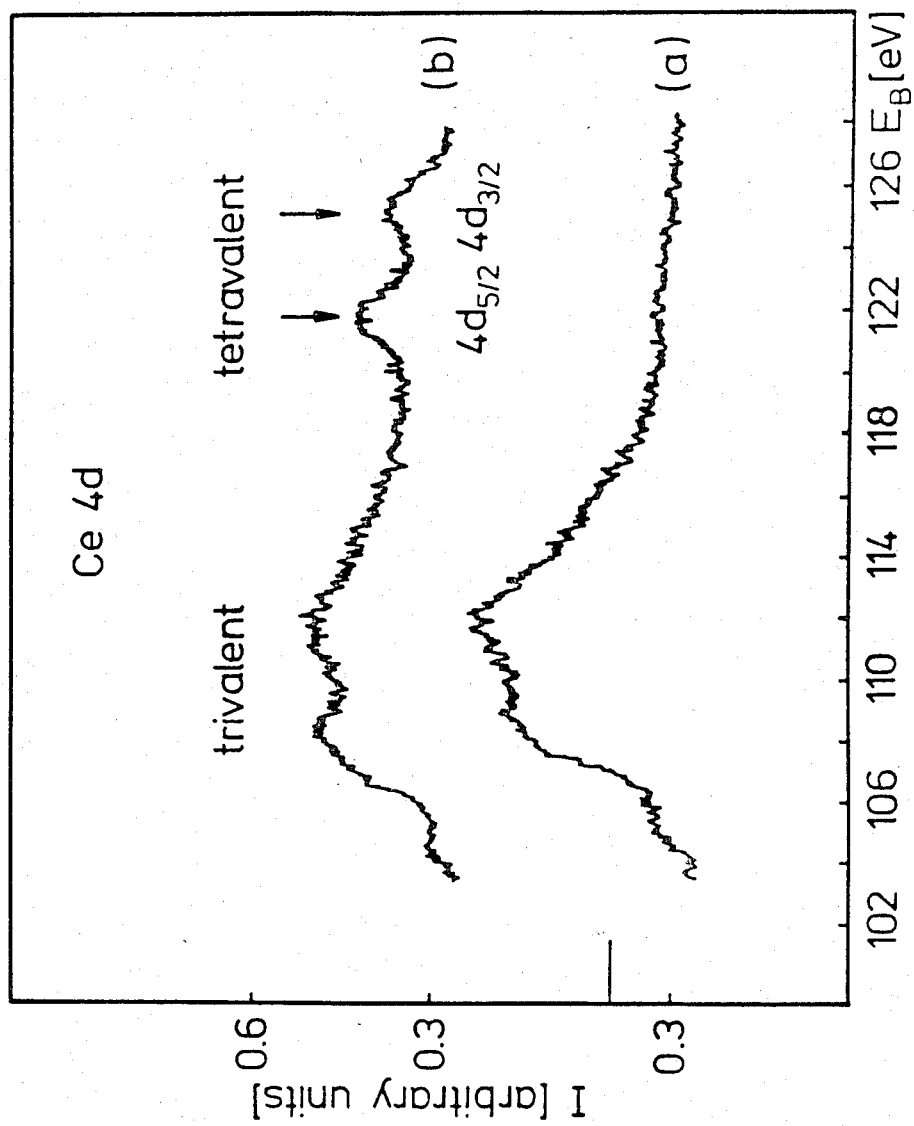
FIG. 4 is a composite XPS spectrum of the cerium overlayer before (a) and after (b) oxygen exposure; the metallic cerium is trivalent only, while the oxidized phase shows in addition the $Ce^{4+}$ species.

FIG. 4 shows the Ce 4d levels of the overlayer before (a) and after (b) exposure to oxygen. While the metallic cerium phase is trivalent (compare Y. Baer & C. Zuercher, Phys. Rev. Lett., Vol. 39, p. 956, 1977) the oxidized cerium shows both trivalent and tetravalent species. When oxidation takes place in water vapor, no evidence of tetravalent cerium in the Ce 4d spectrum is found, and the niobium does not oxidize underneath the cerium. It appears that the catalytic action of cerium is related to the valence change (trivalent to tetravalent) during surface oxidation. $CeO_2$ is known to have high catalytic activity in oxidation reactions, such as in the oxidation of hydrocarbons, where both the ease of the trivalent-to-tetravalent valence change and the high oxygen mobility in $CeO_2$ are well reflected. $CeO_2$ is an oxygen ion conductor, possibly more so in the amorphous than in the crystalline state.

It is known that oxide films formed at low temperatures are amorphous; some of these, such as $Nb_2O_5$ form network structures, where a large oxygen ion can move more easily through the channels of the network than a tightly bound though smaller cation; therefore, these oxide films grow by oxygen ion diffusion.

Because the Mott potential, which develops upon oxidation and aids ion diffusion, is larger in cerium than in niobium, cerium oxidizes easier than niobium. The oxidized cerium on the surface contains a large fraction of $CeO_2$ which ca be reduced to $Ce_2O_3$ by niobium, since the heat of decomposition of $Nb_2O_5$, referring to the formation of one mole of oxygen is 146.8 kcal, while that of $CeO_2$ is only 125 kcal (because the heat of decomposition of $Ce_2O_3$ is 305 kcal, niobium cannot reduce $Ce_2O_3$). With continuing oxygen exposure, the $CeO_2$ which lost oxygen to niobium will reoxidize at the surface, thereby providing oxygen ions for the further oxidation of niobium.

In a second experiment, to study the kinetics of the catalytic oxidation of niobium at $6.6 \times 10^{-6}$ Pa oxygen pressure, using a freshly deposited film of 50 nm niobium covered by 0.9 nm cerium, XPS spectra were taken at times between one minute and seven hours exposure. After 1 minute exposure (3L) the spectrum did not show $Nb_2O_5$ since the cerium on the surface oxidizes first. The next spectrum, taken after 3 minutes, representing 9L oxygen exposure, showed already 1.9 nm of $Nb_2O_5$ formed. This is to be compared with the oxidation of niobium without a catalyst. At 9L exposure, only a very small amount of NbO and $NbO_2$ form, and no $Nb_2O_5$ is detected. See Sanz and Hofmann, supra.

Figure 5:
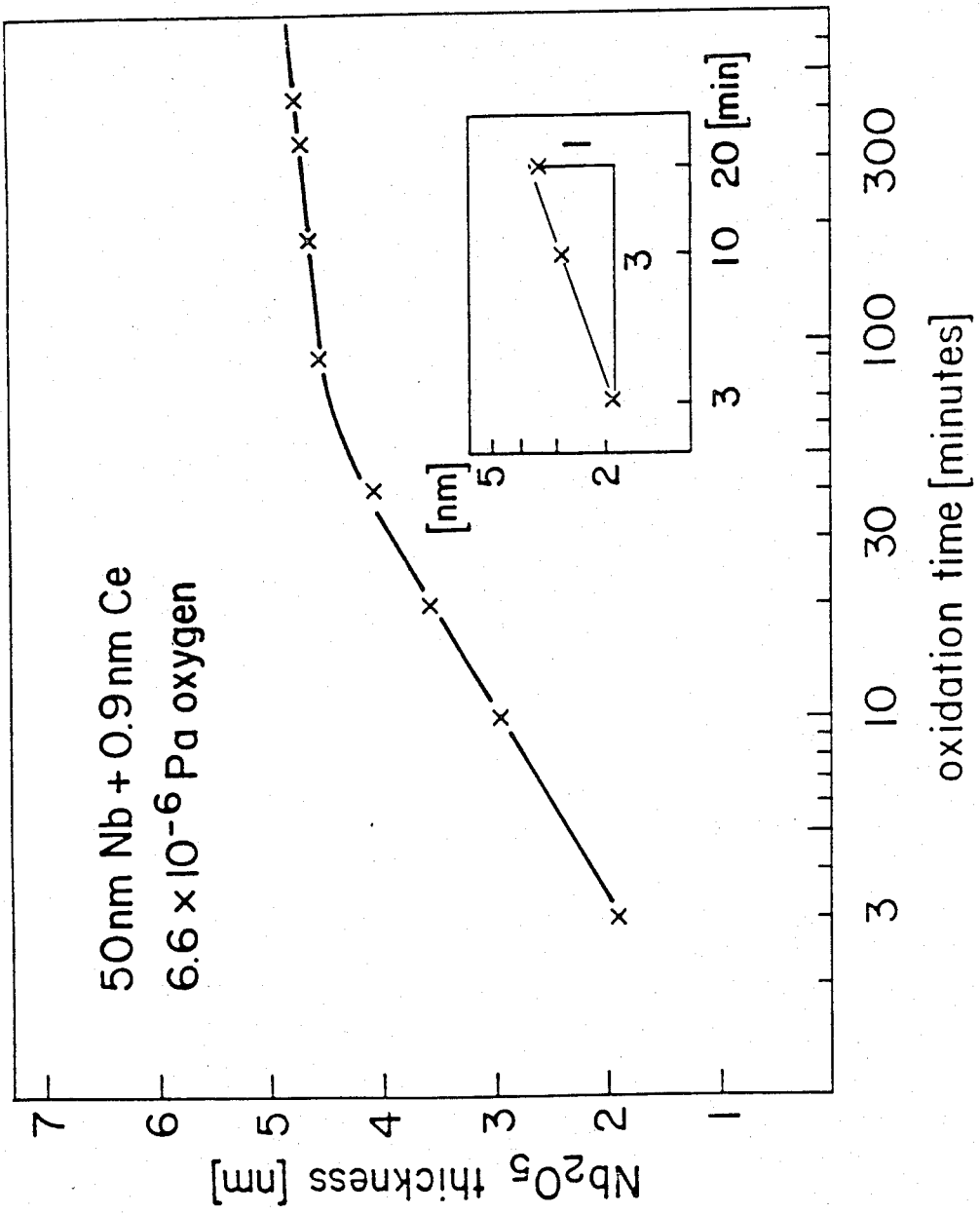
FIG. 5 is a diagram of the thickness of the $Nb_2O_5$ layer as a function of the logarithm of the oxidation time at 300K. The diagram shows fast growth until around 4 nm thickness characterized by a ⅓ slope in log-log presentation (inset) which changes to slow growth characterized by a logarithmic time dependence.

FIG. 5 shows the thickness of the $Nb_2O_5$ layer (calculated by Eq. 1) as a function of the logarithm of the oxidation time. The diagram shows fast growth until around 40 minute oxidation time, which is equivalent to 120L oxygen exposure. Here already 4 nm pure $Nb_2O_5$ is formed. This is to be compared with the oxidation of niobium without a catalyst, where at 120L exposure to oxygen only 0.05 nm of $Nb_2O_5$ forms on top of 0.6 nm of $NbO + NbO_2$. See Sanz & Hofmann, supra. The fast growth is characterized by a $\frac{1}{3}$ slope in the log-log representation (inset), which changes to slow growth characterized by a logarithmic time dependence. The thickness attained after seven hours (1,260L) is 4.8 nm. In the non-catalytic oxidation of niobium, only the slow growth regime is found. The formation of $Nb_2O_5$ is characterized by a logarithmic time dependence. At 1260L oxygen exposure only 0.2 nm $Nb_2O_5$ forms on top of 0.6 nm of $NbO + NbO_2$. See Sanz & Hofmann, supra.

Figure 6:
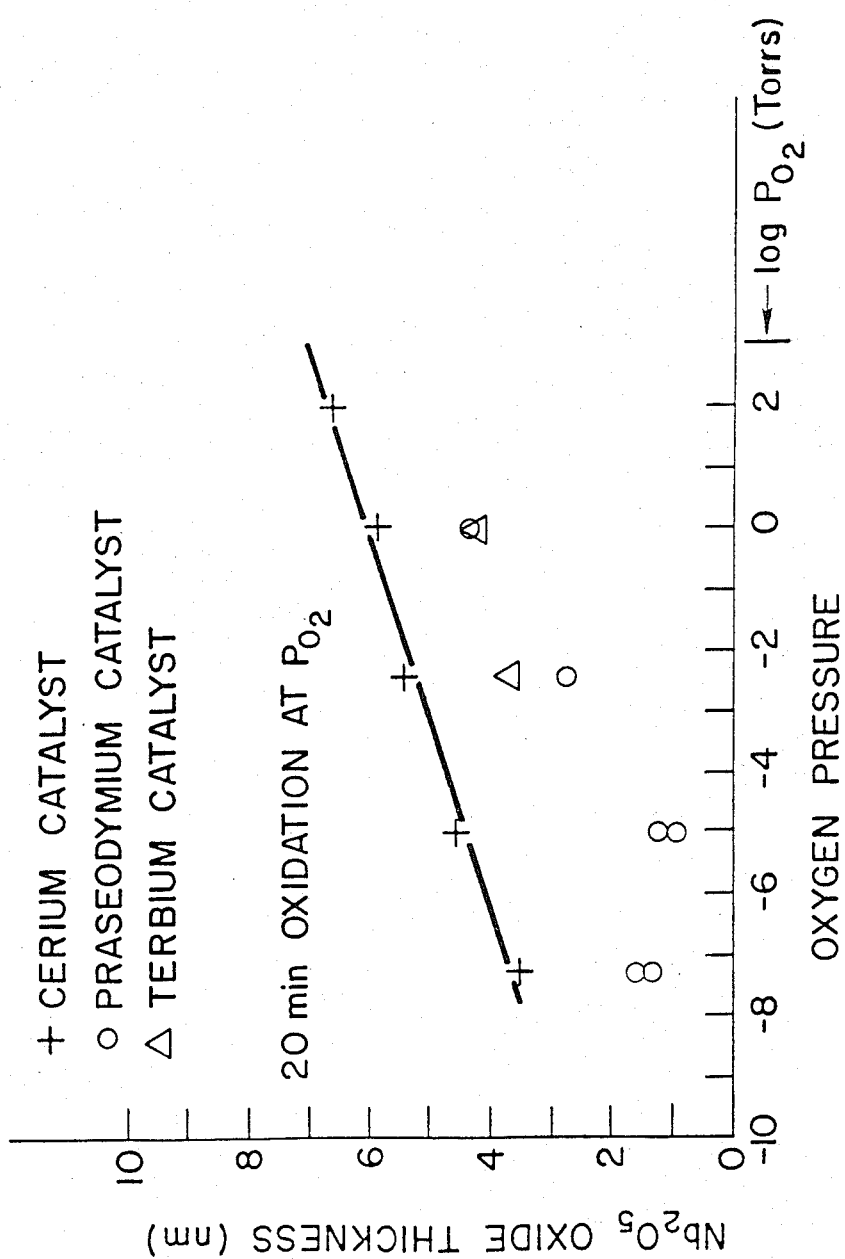
FIG. 6 is a diagram showing dependence of $Nb_2O_5$ oxide thickness on the logarithm of oxygen pressure with cerium, praseodymium and terbium catalysts on niobium.

The catalytic oxidation experiments show that increasing the partial pressure of oxygen increases the thickness of the oxide layer. For example, a 20 minute oxidation at $6.6 \times 10^{-6}$ Pa oxygen pressure results in 3.5 nm thick $Nb_2O_5$, while the same time at $1.32 \times 10^4$ Pa results in 6.7 nm $Nb_2O_5$. See FIG. 6. Increasing the temperature of oxidation from room temperature to somewhat higher temperatures increases oxide thickness exponentially. As described above, the catalytic activity of the cerium enables the growth of significant amounts of $Nb_2O_5$ under well controlled UHV conditions. The thickness is much larger than obtained with pure niobium at atmospheric pressure after comparable exposure times. Yet, the benefit of oxidizing a solid with the aid of a catalyst is not only that the kinetics change and equilibrium is reached in a shorter time, but that this equilibrium state brought about by a catalyst is more perfect with respect to stoichiometry (no lower oxides formed) than a nonequilibrium state. We found that an important characteristic of the cerium catalyst is its trivalent to tetravalent valence change during surface oxidation.

The catalytic activity of other rare earths exhibiting trivalent to tetravalent valence change, such as praseodymium and terbium, is similar to that of cerium. Aluminum, hafnium, titanium, zirconium or tantalum substrate materials, which are oxidizable under controlled conditions to form protective or insulating oxide layers, are useful in place of niobium in certan applications, either as metals or as alloys. Silicon, which forms an $SiO_2$ oxide layer of useful insulating thickness only at extremely high oxidation temperatures, such as 1000 C., can be oxidized at temperatures near ambient with the use of the aforementioned catalysts. Oxide patterns may be produced by patterning of the catalyst prior to oxidation, using masking or etching techniques.

While the invention has been described with reference to a preferred embodiment, cerium catalyst oxidation of niobium, with variations of thickness, and with suggested variations of materials, it will be understood by those skilled in the art that the other valence-changing rare earths and various oxidizable substrate materials and alloys may be used without departing from the spirit and scope of the invention.

We claim:

1. A method for controllably preparing high quality insulating oxide layers on a solid surface of material not normally oxidizable to useful quality or thickness at ambient temperatures within acceptable process time durations characterized by
    (a) depositing a very thin layer, 1–10 monolayers, of a rare earth having catalytic activity related to valence increase during oxidation; and
    (b) exposing to oxygen in a humidity-free atmosphere for a duration and at an oxygen partial pressure required to grow the desired oxide thickness at ambient or slightly elevated temperature; whereby oxide layers are grown below threshold values for oxidation of equivalent parameters absent catalytic activity.

2. The method of claim 1, wherein said very thin layer of catalyst is cerium of thickness less than 3 nm.

3. The method of claim 1, wherein said very thin layer of catalyst is terbium of thickness less than 3 nm.

4. The method of claim 1, wherein said very thin layer of catalyst is praseodymium of thickness less than 3 nm.

5. The method of claim 1, wherein said solid surface of material not normally oxidizable is one or an alloy of aluminum, hafnium, silicon or tantalum.

6. The method of claim 1, further characterized in that said catalyst is configured in a pattern.

* * * * *